(12) United States Patent
Yip

(10) Patent No.: US 11,081,165 B2
(45) Date of Patent: *Aug. 3, 2021

(54) MEMORIES FOR DECODING MEMORY ACCESS ADDRESSES FOR ACCESS OPERATIONS

(71) Applicant: MICRON TECHNOLOGY, INC., Boise, ID (US)

(72) Inventor: Aaron S. Yip, Los Gatos, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/913,115

(22) Filed: Jun. 26, 2020

(65) Prior Publication Data

US 2020/0327922 A1  Oct. 15, 2020

Related U.S. Application Data

(63) Continuation of application No. 16/101,600, filed on Aug. 13, 2018, now Pat. No. 10,714,166.

(51) Int. Cl.
| | | |
|---|---|---|
| *G11C 11/408* | (2006.01) |
| *G11C 7/10* | (2006.01) |
| *G11C 16/08* | (2006.01) |
| *G11C 7/12* | (2006.01) |
| *G11C 8/08* | (2006.01) |
| *G11C 8/12* | (2006.01) |
| *G11C 16/04* | (2006.01) |
| *G11C 8/10* | (2006.01) |

(52) U.S. Cl.
CPC ........ *G11C 11/4087* (2013.01); *G11C 7/1006* (2013.01); *G11C 7/1018* (2013.01); *G11C 7/1072* (2013.01); *G11C 7/12* (2013.01); *G11C 8/08* (2013.01); *G11C 16/08* (2013.01); *G11C 8/10* (2013.01); *G11C 8/12* (2013.01); *G11C 16/0483* (2013.01)

(58) Field of Classification Search
CPC ....... G11C 8/08; G11C 16/10; G11C 11/4087; G11C 7/1072; G11C 7/1018; G11C 16/08; G11C 7/12; G11C 7/1006; G11C 8/12; G11C 16/0483; G11C 8/10; G11C 8/04
USPC ........................................ 365/185.24, 230.06
See application file for complete search history.

(56) References Cited

U.S. PATENT DOCUMENTS

| | | | |
|---|---|---|---|
| 5,587,960 A | 12/1996 | Ferris | |
| 6,335,890 B1 | 1/2002 | Reohr et al. | |
| 7,206,223 B1 | 4/2007 | Nahas et al. | |
| 9,911,481 B1 | 3/2018 | Alam et al. | |
| 2001/0020840 A1 | 9/2001 | Kojima | |
| 2003/0156103 A1* | 8/2003 | Ota | G09G 3/3692 345/204 |
| 2003/0174574 A1 | 9/2003 | Perner et al. | |
| 2004/0109340 A1 | 6/2004 | Kang | |
| 2005/0117424 A1 | 6/2005 | Sung | |
| 2005/0212785 A1* | 9/2005 | Fukuda | G09G 5/395 345/204 |

(Continued)

*Primary Examiner* — Michael T Tran
(74) *Attorney, Agent, or Firm* — Dicke, Billig & Czaja, PLLC

(57) ABSTRACT

Memories having block select circuitry having an output that is selectively connected to a plurality of driver circuitries, with each driver circuitry connected to a respective block of memory cells.

22 Claims, 12 Drawing Sheets

(56) References Cited

U.S. PATENT DOCUMENTS

| | | | |
|---|---|---|---|
| 2005/0232013 A1* | 10/2005 | Kawai | G11C 16/3459 365/185.18 |
| 2007/0025171 A1 | 2/2007 | Kuroda | |
| 2007/0030741 A1* | 2/2007 | Nii | G11C 8/08 365/189.11 |
| 2007/0058428 A1* | 3/2007 | Kang | G11C 8/08 365/185.02 |
| 2007/0097741 A1* | 5/2007 | Kang | G11C 13/0004 365/163 |
| 2007/0242503 A1* | 10/2007 | Choi | G11C 8/10 365/163 |
| 2008/0055991 A1* | 3/2008 | Kim | G11C 16/0483 365/185.11 |
| 2008/0084778 A1 | 4/2008 | Lin | |
| 2008/0123423 A1* | 5/2008 | Kim | G06F 3/0629 365/185.11 |
| 2009/0161437 A1* | 6/2009 | Pyeon | G11C 16/12 365/185.17 |
| 2009/0175081 A1* | 7/2009 | Kim | G11C 16/0483 365/185.11 |
| 2009/0231908 A1* | 9/2009 | Uematsu | G11C 11/413 365/154 |
| 2009/0244982 A1 | 10/2009 | Han et al. | |
| 2009/0273983 A1* | 11/2009 | Lee | G11C 16/10 365/185.23 |
| 2009/0323400 A1* | 12/2009 | Shinozaki | G11C 11/413 365/154 |
| 2010/0157695 A1 | 6/2010 | Schreiber et al. | |
| 2010/0260003 A1* | 10/2010 | Oh | G11C 11/406 365/222 |
| 2011/0002178 A1* | 1/2011 | Hwang | H01L 21/30604 365/189.011 |
| 2011/0158029 A1* | 6/2011 | Sasaki | G11C 8/08 365/230.06 |
| 2011/0242912 A1* | 10/2011 | Kang | G11C 8/08 365/194 |
| 2011/0261615 A1* | 10/2011 | Choi | G11C 13/0069 365/163 |
| 2011/0261633 A1* | 10/2011 | Chandra | G11C 11/413 365/189.15 |
| 2012/0044733 A1 | 2/2012 | Scheuerlein | |
| 2013/0208528 A1 | 8/2013 | Kwak et al. | |
| 2013/0308363 A1 | 11/2013 | Scheuerlein et al. | |
| 2014/0010032 A1* | 1/2014 | Seshadri | G11C 7/12 365/203 |
| 2014/0010034 A1 | 1/2014 | Ide | |
| 2014/0056057 A1* | 2/2014 | Ozawa | G11C 11/412 365/154 |
| 2014/0112074 A1 | 4/2014 | Rhie | |
| 2014/0119101 A1 | 5/2014 | Wang et al. | |
| 2014/0219043 A1 | 8/2014 | Jones et al. | |
| 2014/0250341 A1 | 9/2014 | Mullarkey | |
| 2014/0253198 A1 | 9/2014 | Ma et al. | |
| 2014/0313845 A1 | 10/2014 | Ko | |
| 2014/0347951 A1 | 11/2014 | Kim | |
| 2015/0029804 A1 | 1/2015 | Xia et al. | |
| 2015/0170729 A1 | 6/2015 | Schaefer et al. | |
| 2015/0255146 A1 | 9/2015 | Mochida | |
| 2015/0262693 A1* | 9/2015 | Kondo | G11C 7/02 365/185.12 |
| 2015/0302918 A1 | 10/2015 | Roy et al. | |
| 2016/0042783 A1 | 2/2016 | Masuoka et al. | |
| 2016/0049201 A1 | 2/2016 | Lue et al. | |
| 2016/0099042 A1* | 4/2016 | Lin | G11C 11/4096 365/222 |
| 2016/0189777 A1* | 6/2016 | Yoshihara | G11C 16/26 365/185.17 |
| 2016/0267981 A1* | 9/2016 | Hioka | G11C 7/08 |
| 2017/0228189 A1* | 8/2017 | Sudo | G06F 3/0638 |
| 2017/0229183 A1* | 8/2017 | MacCarrone | G06F 3/0625 |
| 2017/0263324 A1 | 9/2017 | Muller et al. | |
| 2017/0358344 A1* | 12/2017 | Ishii | G11C 7/222 |
| 2017/0372794 A1* | 12/2017 | Walker | G11C 29/021 |
| 2018/0025760 A1* | 1/2018 | Mazumder | G11C 29/00 365/189.02 |
| 2018/0278461 A1 | 9/2018 | Hollis et al. | |
| 2019/0189185 A1 | 6/2019 | Hush et al. | |
| 2019/0221242 A1 | 7/2019 | Andre et al. | |
| 2019/0237143 A1 | 8/2019 | Minamoto et al. | |
| 2019/0260362 A1 | 8/2019 | Kashihara | |
| 2019/0265975 A1 | 8/2019 | Jean | |
| 2019/0267082 A1 | 8/2019 | Parkinson et al. | |
| 2019/0348140 A1 | 11/2019 | Cho et al. | |
| 2019/0370111 A1 | 12/2019 | Barbato | |
| 2020/0379898 A1* | 12/2020 | Yang | G11C 11/5642 |
| 2020/0381025 A1 | 12/2020 | Kim | G11C 8/18 |
| 2020/0381051 A1* | 12/2020 | Her | G11C 16/14 |
| 2020/0387329 A1* | 12/2020 | Choi | G11C 16/10 |
| 2020/0402555 A1* | 12/2020 | Choi | G11C 7/222 |
| 2021/0065805 A1* | 3/2021 | Choi | G11C 16/0441 |
| 2021/0074348 A1* | 3/2021 | Prather | G11C 11/407 |
| 2021/0082511 A1* | 3/2021 | Ogawa | G11C 16/0483 |
| 2021/0090660 A1* | 3/2021 | Kim | G11C 16/10 |

* cited by examiner

MEMORIES FOR DECODING MEMORY ACCESS ADDRESSES FOR ACCESS OPERATIONS

RELATED APPLICATION

This Application is a Continuation of U.S. application Ser. No. 16/101,600, titled "APPARATUS AND METHODS FOR DECODING MEMORY ACCESS ADDRESSES FOR ACCESS OPERATIONS," filed Aug. 13, 2018, now U.S. Pat. No. 10,714,166 issued on Jul. 14, 2020, which is commonly assigned and incorporated herein by reference.

TECHNICAL FIELD

The present disclosure relates generally to memory and, in particular, in one or more embodiments, the present disclosure relates to apparatus and methods for decoding memory access addresses for access operations.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

As performance criteria for systems using memory become more demanding, a desire for faster access of memories may result.

DETAILED DESCRIPTION

Figure 1:
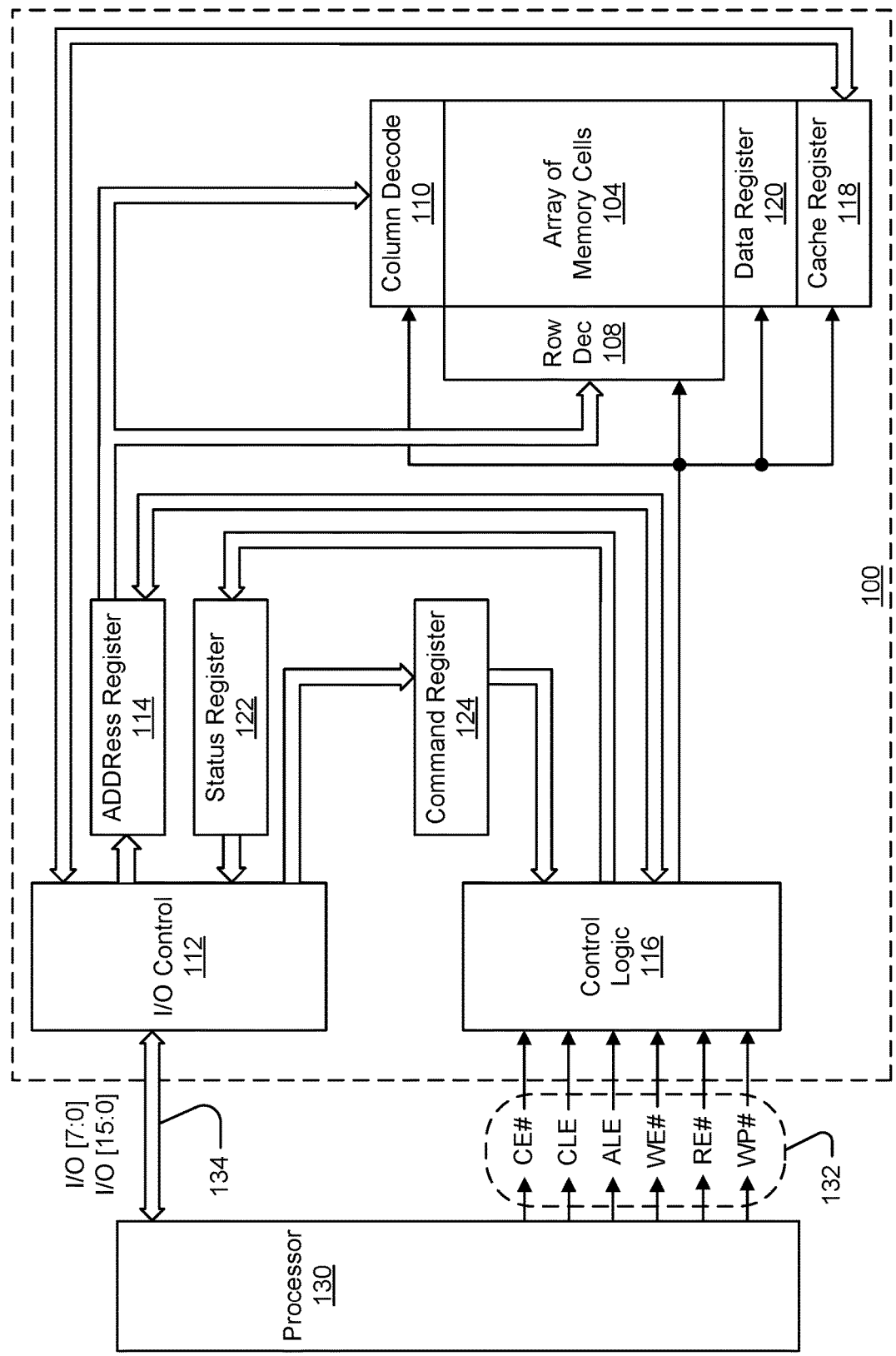
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. The row decode circuitry 108 may be configured to access blocks of memory cells in accordance with embodiments. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown) to sense a data state of a memory cell of the array of memory cells 104. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
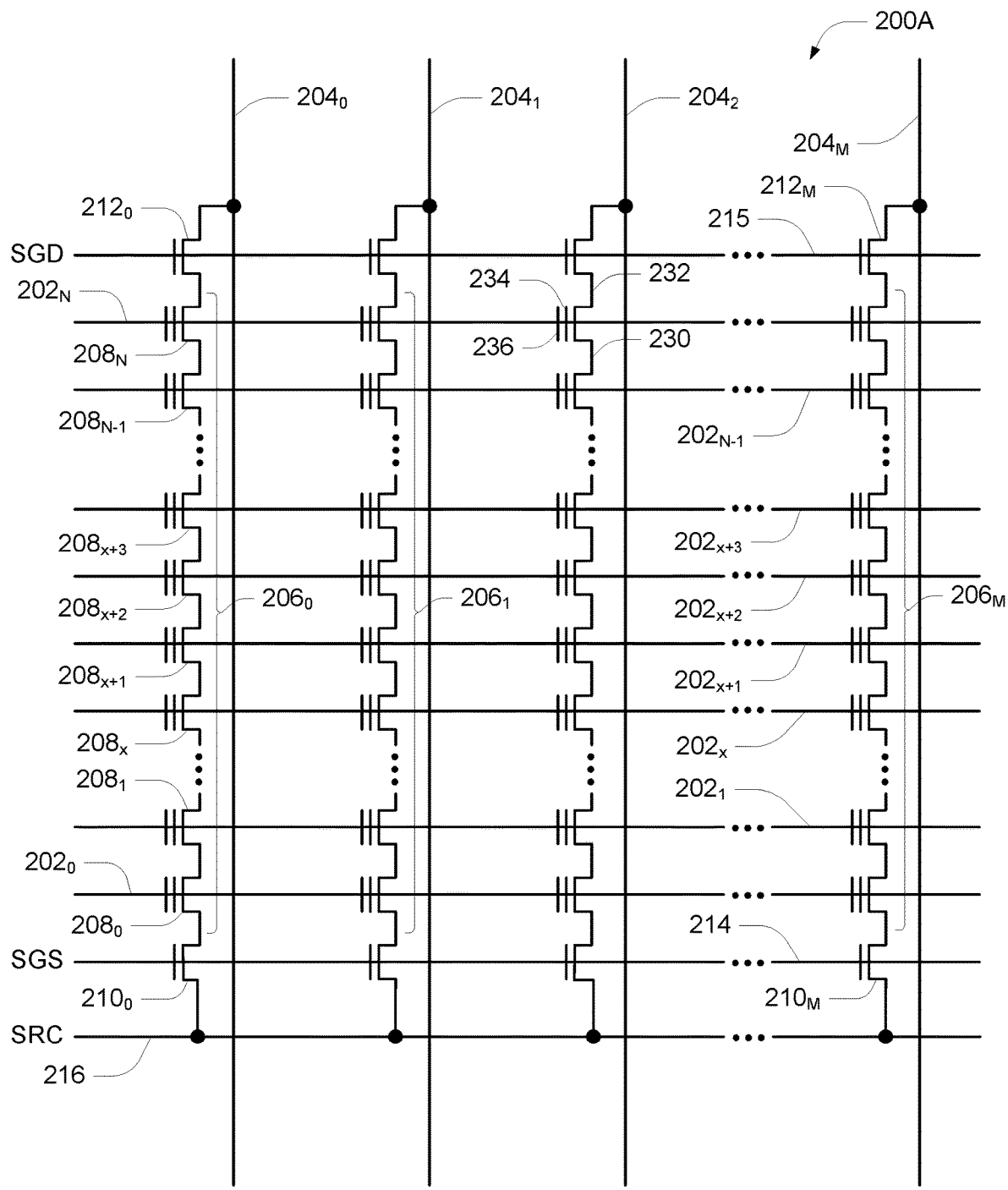
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data.

The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell 208N of the corresponding NAND string 206. For example, the source of select gate $212_0$ might be connected to memory cell 208N of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 2B:
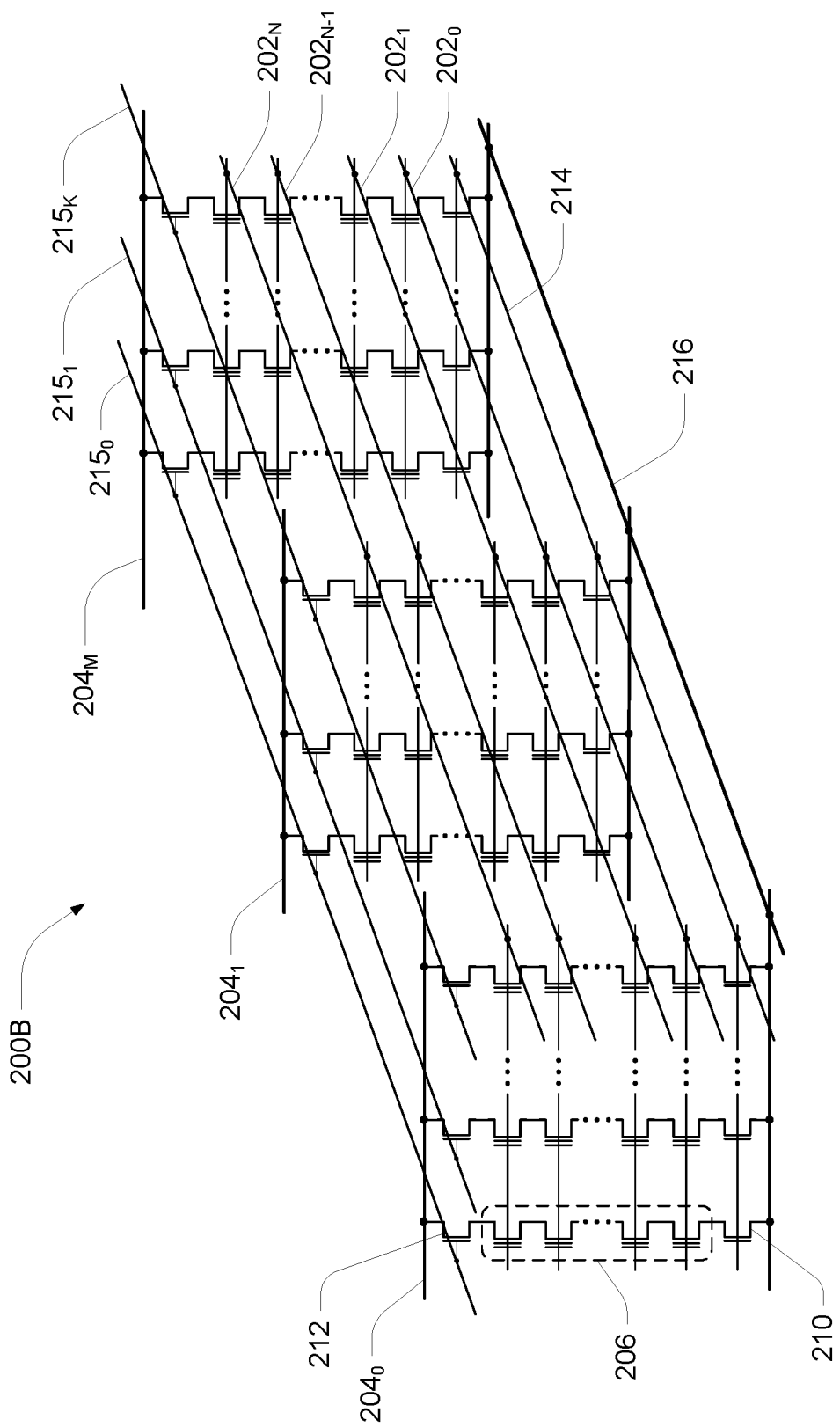

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
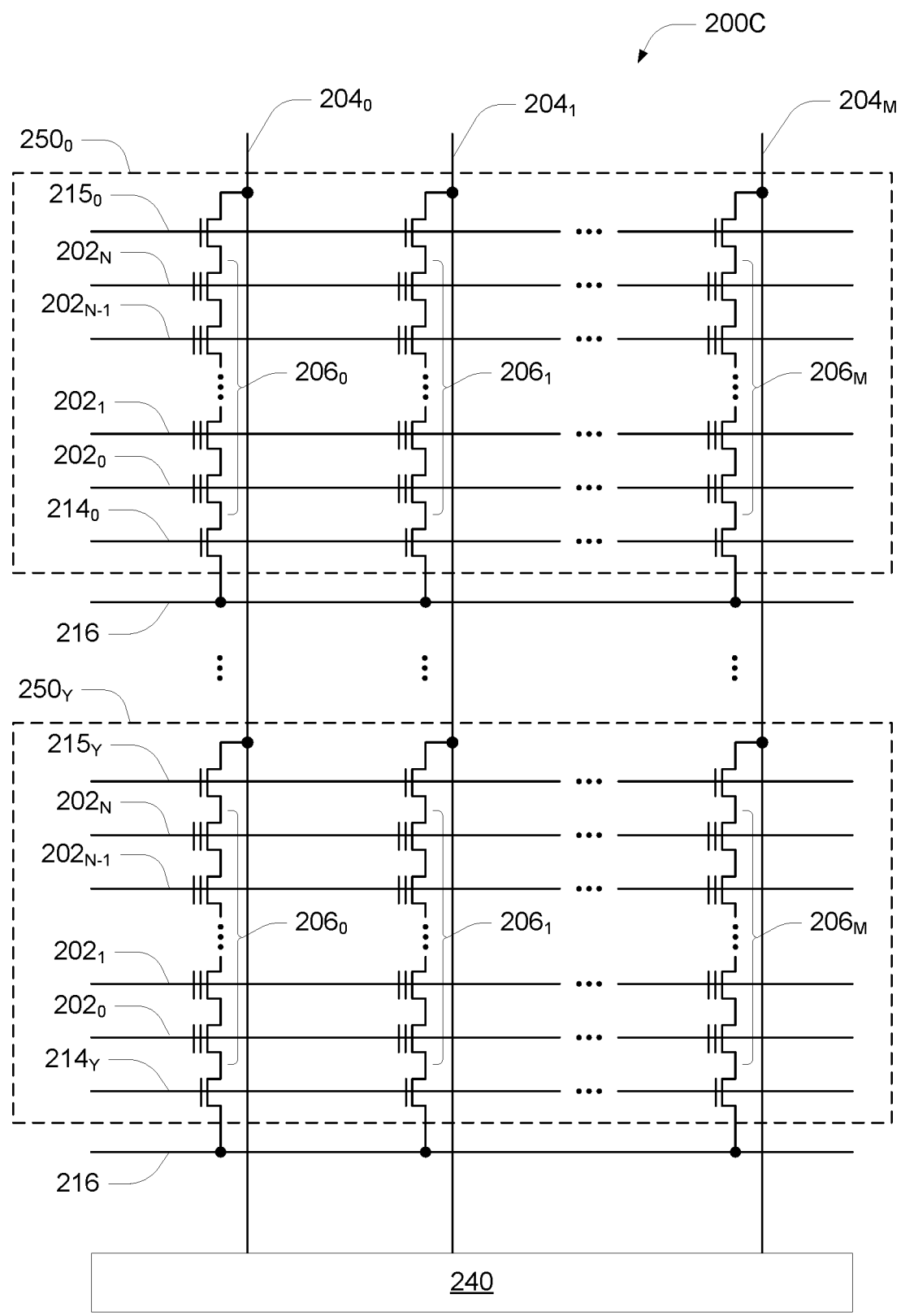

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_K$. For example, each block of memory cells $250_0$-$250_K$ might be commonly selectively connected to the source 216. Access lines 202 and select lines 214 and 214 of one block of memory cells 250 may have no direct connection to access lines 202 and select lines 214 and 214, respectively, of any other block of memory cells 250. They may, however, be selectively commonly connected through global access lines and global select lines as will be described with reference to FIG. 6.

The data lines $204_0$-$204_M$ may be connected (e.g., selectively connected) to a buffer portion 240, which might be a portion of a page buffer of the memory. The buffer portion 240 might correspond to a memory plane (e.g., the set of blocks of memory cells $250_0$-$250_K$). The buffer portion 240 might include sensing devices (not shown) for sensing data values indicated on respective data lines 204, and corresponding registers (not shown) for storage of the sensed data values from its corresponding memory plane.

Figure 3A:
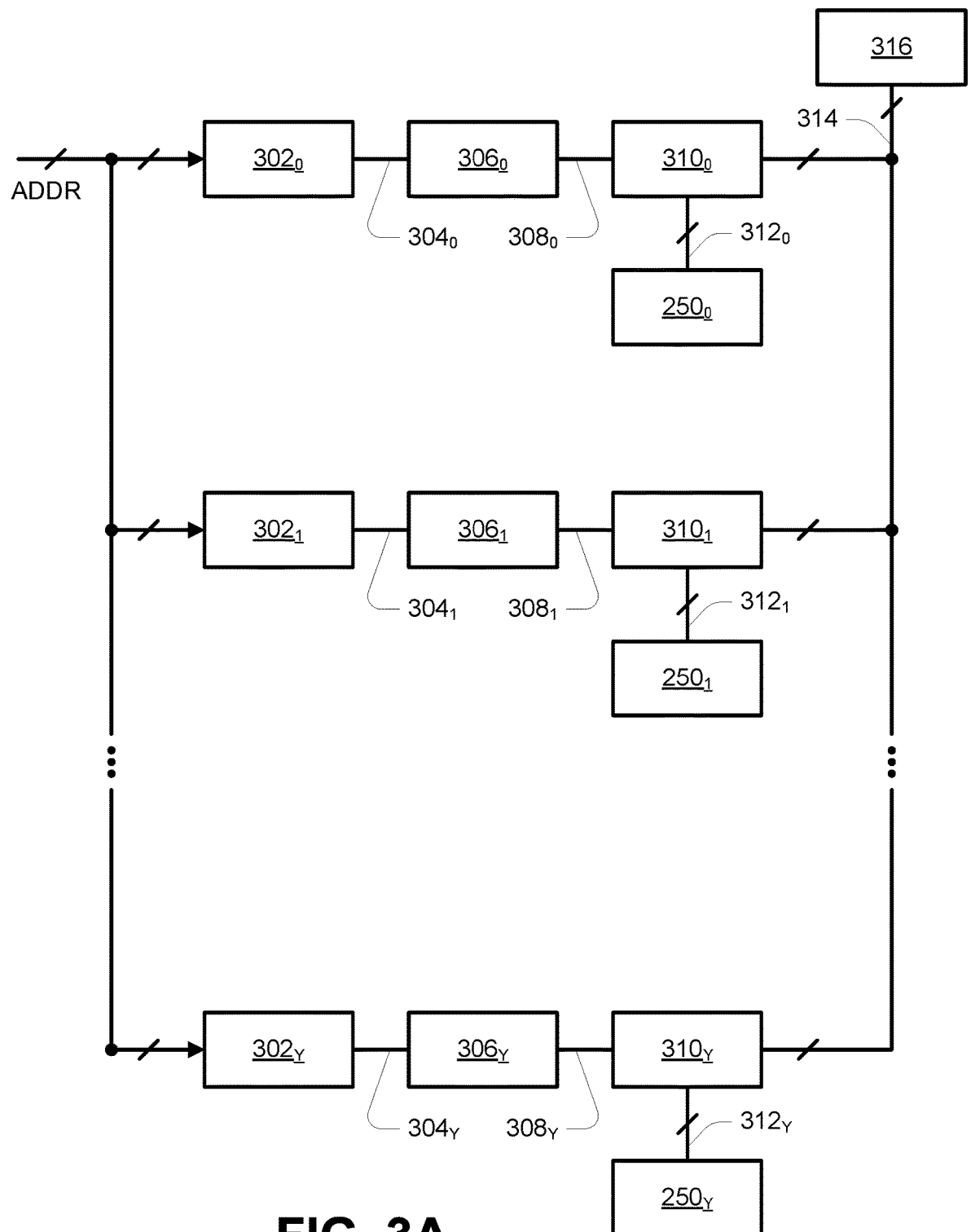
FIG. 3A is a block schematic of components of row decode circuitry for access of a plurality of blocks of memory cells of the related art.

FIG. 3A is a block schematic of components of row decode circuitry for access of a plurality of blocks of memory cells of the related art. In FIG. 3A, block decoding circuitry 302 (e.g., decoding circuitries $302_0$-$302_Y$) might be configured to receive address signals (ADDR). The address signals ADDR may include all address signals from the address register 114. Alternatively, the address signals ADDR may represent only a portion of the address signals from the address register 114, such as those signals indicative of a block of memory cells. Each block decoding circuitry 302 may correspond to a respective block of memory cells 250. For example, block decoding circuitry $302_0$ may correspond to the block of memory cells $250_0$. In response to the address signals ADDR, each block decoding circuitry 302 (e.g., decoding circuitries $302_0$-$302_Y$) might provide a respective enable signal 304 (e.g., enable signals $304_0$-$304_Y$) to a respective block select circuitry 306 (e.g., block select circuitries $306_0$-$306_Y$). For example, block decoding circuitry $302_0$ might provide the enable signal $304_0$ to the block select circuitry $306_0$.

Each enable signal 304 might indicate whether its respective block of memory cells 250 is selected for an access operation, e.g., a read (or sense) operation, a programming (or write) operation, or an erase operation. For example, the enable signal 304 might have a first logic level (e.g., voltage level) when its respective block of memory cells 250 is selected for the access operation, and a second logic level (e.g., voltage level), different than the first logic level, when its respective block of memory cells 250 is not selected for the access operation.

Each block select circuitry 306 (e.g., block select circuitries $306_0$-$306_Y$) might provide a control signal 308 (e.g., control signals $308_0$-$308_Y$), in response to its respective enable signal 304 (e.g., enable signals $304_0$-$304_Y$), to a respective driver circuitry 310 (e.g., driver circuitries $310_0$-$310_Y$). For example, block decoding circuitry $302_0$ might provide the control signal $308_0$ to the driver circuitry $310_0$. In general, driver circuitry selectively connects one or more access lines (e.g., local access lines) and/or one or more select lines (e.g., local select lines) of a block of memory cells to global access lines and/or global select lines, respectively, that are selectively connected to local access lines and/or local select lines of a plurality of blocks of memory cells through respective driver circuitries for those blocks of memory cells.

Each control signal 308 might have a first voltage level when its respective enable signal 304 has the first logic level, and might have a second voltage level, different than (e.g., lower than) its first voltage level when its respective enable signal 304 has the second logic level. The first voltage level of a control signal 308 might be selected to activate a switch (e.g., transistor) of its respective driver circuitry 310 (e.g., driver circuitries $310_0$-$310_Y$), and the second voltage level of the control signal 308 might be selected to deactivate the switch of its respective driver circuitry 310. The switch might be connected between a local access line or local select line (e.g., a line of the local access and select lines 312, e.g., local access and select lines $312_0$-$312_Y$) connected to its respective block of memory cells 250 and global access line or global select line, respectively (e.g., a line of the global access and select lines 314). The global access and select lines 314 might receive a plurality of applied voltage levels from voltage generation and selection circuitry 316.

These voltage levels of a control signal 308 might vary depending upon the access operation selected. For example, a programming operation might apply voltages to the global access and select lines 314 ranging up to 25V or more. In contrast, a read operation might apply voltages to the global access and select lines 314 of less than or equal to 10V. For either access operation, the first voltage level of the control signal 308 might then be some voltage level configured to sufficiently pass voltage levels from the global access and select lines 314 to their respective local access and select lines 312, e.g., the first voltage level might be higher than a maximum voltage level of the global access and select lines 314. Conversely, the second voltage level of the control signal 308 might be some voltage level configured to isolate each of the global access and select lines 314 from their respective local access and select lines 312.

Figure 3B:
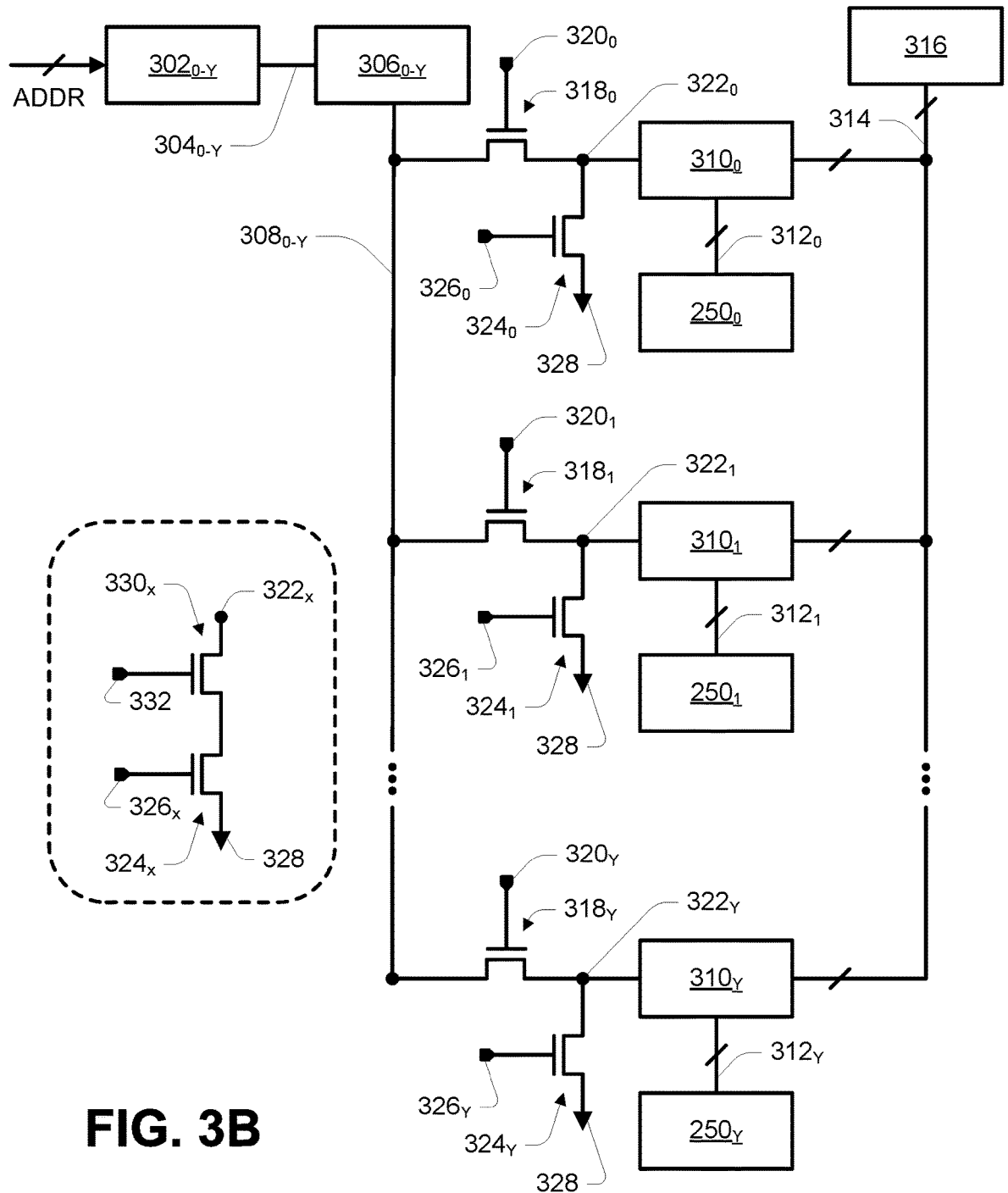
FIG. 3B is a block schematic of components of row decode circuitry for access of a plurality of blocks of memory cells according to an embodiment.

FIG. 3B is a block schematic of components of row decode circuitry for access of a plurality of blocks of memory cells according to an embodiment. In contrast to the row decode circuitry of FIG. 3A, there might be a single block decoding circuitry 302 (e.g., block decoding circuitry $302_{0-Y}$) corresponding to a number of blocks of memory cells 250 (e.g., blocks of memory cells $250_0$-$250_Y$). The block decoding circuitry $302_{0-Y}$ might be configured to receive address signals (ADDR). The address signals ADDR may include all address signals from the address register 114. Alternatively, the address signals ADDR may represent only a portion of the address signals from the address register 114, such as those signals indicative of a block of memory cells. In response to the address signals ADDR, the block decoding circuitry $302_{0-Y}$ might provide an enable signal $304_{0-Y}$ to block select circuitry $306_{0-Y}$.

The enable signal $304_{0-Y}$ might indicate whether any block of memory cells (e.g., one or more blocks of memory cells) of the blocks of memory cells $250_0$-$250_Y$ is selected for an access operation, e.g., a read (or sense) operation, a programming (or write) operation, or an erase operation. For example, the enable signal $304_{0-Y}$ might have a first logic level (e.g., voltage level) when any block of memory cells $250_0$-$250_Y$ is selected for the access operation, and a second logic level (e.g., voltage level), different than the first logic level, when no block of memory cells $250_0$-$250_Y$ is selected for the access operation.

The block select circuitry $306_{0-Y}$ might provide a control signal $308_{0-Y}$, in response to the enable signal $304_{0-Y}$, to a number of switches, such as n-type field effect transistors (nFETs) $318_0$-$318_Y$. The control signal $308_{0-Y}$ might have a first voltage level when the enable signal $304_{0-Y}$ has the first logic level, and might have a second voltage level, different than (e.g., lower than) its first voltage level when the enable signal $304_{0-Y}$ has the second logic level. The first voltage level of the control signal $308_{0-Y}$ might be up to 29V for a programming operation, for example.

Each switch 318 (e.g., nFETs $318_0$-$318_Y$) might be configured to receive a respective control signal 320 (e.g., control signals $320_0$-$320_Y$) to selectively connect the control signal $308_{0-Y}$ to a respective voltage node 322 (e.g., voltage nodes $322_0$-$322_Y$). Each control signal 320 might be configured to have a first voltage level configured to activate its respective switch 318 when its respective block 250 is selected for the access operation, and might be configured to have a second voltage level, different than its first voltage level, configured to deactivate its respective switch 318 when its respective block 250 is not selected for the access operation. When a switch 318 is activated, it will be deemed to connect (e.g., apply) the control signal $308_{0-Y}$ to its respective voltage node 322, even though it might be expected to reduce the voltage of the control signal $308_{0-Y}$, e.g., by a threshold voltage of the switch, or nFET, 318. When a switch 318 is deactivated, it will be deemed to isolate the control signal $308_{0-Y}$ from its respective voltage node 322.

Each voltage node 322 (e.g., voltage nodes $322_0$-$322_Y$) might be connected to a respective driver circuitry 310 (e.g., driver circuitries $310_0$-$310_Y$). The first voltage level of the control signal $308_{0-Y}$ might be selected to activate a switch (e.g., transistor) of a selected driver circuitry 310 (e.g., one or more of driver circuitries $310_0$-$310_Y$), and the second voltage level of the control signal 308 might be selected to deactivate a switch of any remaining driver circuitry 310. The switch might be connected between a local access line or local select line (e.g., a line of the local access and select lines 312, e.g., local access and select lines $312_0$-$312_Y$) connected to its respective block of memory cells 250 and global access line or global select line, respectively (e.g., a line of the global access and select lines 314). The global access and select lines 314 might receive a plurality of applied voltage levels from voltage generation and selection circuitry 316.

The voltage levels of the control signal $308_{0-Y}$ might vary depending upon the access operation selected. For example, a programming operation might apply voltages to the global access and select lines 314 ranging up to 25V or more. In contrast, a read operation might apply voltages to the global access and select lines 314 of less than or equal to 10V. For either access operation, the first voltage level of the control signal 308 might then be some voltage level configured to connect the global access and select lines 314 to their respective local access and select lines 312. However, unlike the row decoding circuitry of FIG. 3A, the first voltage level of the control signal $308_{0-Y}$ in the embodiment of FIG. 3B need not be higher than a maximum voltage level of the global access and select lines 314. In particular, as described in more detail with reference to FIGS. 9A-9B, as voltages of the local access and select lines 312 are increased following their connection to the global access and select lines 314, the voltage level of the respective voltage node 322 may be bootstrapped up due to capacitive coupling. As such, the voltage level of the control signal $308_{0-Y}$ passed to a voltage node 322 corresponding to a selected block of memory cells 250 might be less than or equal to the maximum voltage level of the global access and select lines 314.

Consider the example of a programming operation for a selected block of memory cells $250_0$ and having a programming voltage Vpgm of 25V. The control signal $308_{0-Y}$ and the control signal $320_0$ might have a same voltage level as the programming voltage Vpgm (e.g., 25V), and might result in passing a voltage level of 23V to the voltage node $322_0$. Such a voltage level would be sufficient to connect the global access and select lines 314 to their respective local access and select lines $312_0$, but would be insufficient to pass the programming voltage Vpgm to a selected local access line. However, as the voltage levels of the local access and select lines $312_0$ increase, the voltage level of the voltage node $322_0$ will increase due to capacitive coupling, and may increase to a level higher than the programming voltage Vpgm. This may be facilitated by the nFET $318_0$, which can act to trap the voltage level of the voltage node $322_0$ when the Vgs of the nFET $318_0$ becomes less than its threshold voltage. Because the voltage level $308_{0-Y}$ need not be higher than the maximum voltage level of the global access and select lines 314 to be passed to the local access and select lines $312_0$, power savings can be achieved over the row decoding circuitry of FIG. 3A. Alternatively, the voltage level $308_{0-Y}$ could be higher than the maximum voltage level of the global access and select lines 314 to be passed to the local access and select lines $312_0$, resulting in higher levels of overdrive voltage to the switches of the driver circuitry $310_0$ over the row decoding circuitry of FIG. 3A. The second voltage level of the control signal $308_{0-Y}$ might be some voltage level configured to isolate each of the global access and select lines 314 from their respective local access and select lines 312, and may be less than 0V, e.g., -2V.

Each voltage node 322 might further be connected (e.g., selectively connected) to a respective switch (e.g., nFET) 324 (e.g., nFETs $324_0$-$324_Y$). Each switch 324 (e.g., nFETs $324_0$-$324_Y$) might be configured to receive a respective control signal 326 (e.g., control signals $326_0$-$326_Y$) to selectively connect the respective voltage node 322 (e.g., voltage nodes $322_0$-$322_Y$) to a current sink, such as a ground node, 328. The current sink 328 might be a common current sink for each of the switches $324_0$-$324_Y$. Each control signal 326 might be configured to have a first voltage level configured to activate its respective switch 324 when its respective block 250 is not selected for the access operation, and might be configured to have a second voltage level, different than its first voltage level, configured to deactivate its respective switch 324 when its respective block 250 is selected for the access operation. When a switch 324 is activated, it will be deemed to sink current from its respective voltage node 322, even though the voltage level of the respective voltage node 322 might be a same voltage level as the current sink 328. The first voltage level of a control signal 326 might be some positive voltage level, such as the supply voltage Vcc, and may be higher, such as a pass voltage Vpass commonly used to activate a memory cell, regardless of its programmed state, e.g., 10V. The second voltage level of a control signal 326 might be some neutral or negative voltage level, such as the supply voltage Vss or −2V.

For some embodiments, an additional switch might be connected between a voltage node 322 and its respective switch 324. For example, in the dashed box, the connection of a voltage node $322_x$, which might represent any of the voltage nodes $322_0$-$322_Y$, to its respective switch $324_x$, might include a respective intervening switch, e.g., nFET, $330_x$. Because the voltage nodes 322 may experience high voltage levels, sudden activation of a switch 324 may induce high stress levels to that switch 324. A switch 330 connected in series between its respective voltage node 322 and switch 324 might serve to reduce this stress. Each switch $330_x$ might be configured to receive a control signal 332. The control signal 332 may be common to each switch $330_x$, and may be configured to activate those switches $330_x$ to provide current flow between its respective voltage node $322_x$ and its respective switch $324_x$.

Figure 4:
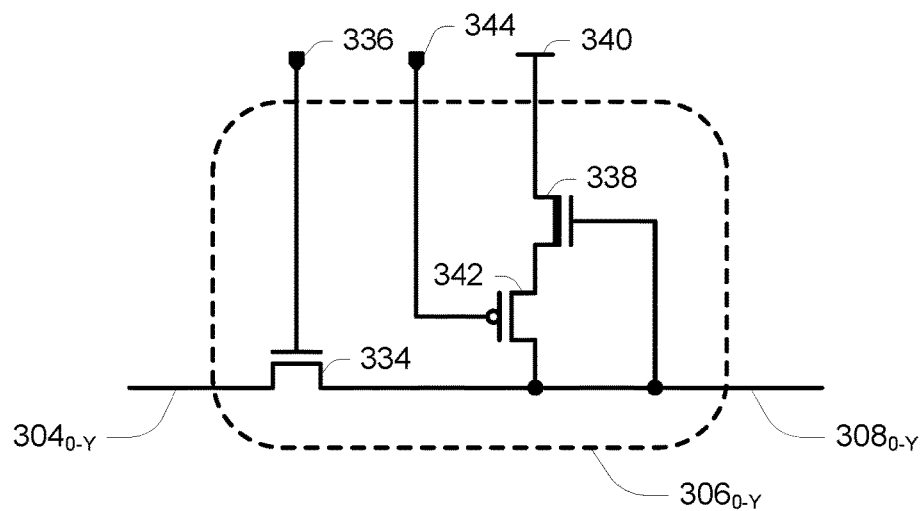
FIG. 4 is a schematic of block select circuitry according to an embodiment.

FIG. 4 is a schematic of block select circuitry $306_{0-Y}$ according to an embodiment. The block select circuitry $306_{0-Y}$ might include a first nFET 334 connected between an input of the block select circuitry $306_{0-Y}$ configured to receive the enable signal $304_{0-Y}$, and an output of the block select circuitry $306_{0-Y}$ configured to provide the control signal $308_{0-Y}$. The first nFET 334 might be configured to receive (e.g., have its control gate connected to receive) a control signal 336. The block select circuitry $306_{0-Y}$ might further include a second nFET 338 connected between a voltage node 340 and a p-type field-effect transistor (pFET) 342. The second nFET 338 might have its control gate connected to the output of the block select circuitry $306_{0-Y}$. The pFET 342 might be connected between the second nFET 338 and the output of the block select circuitry $306_{0-Y}$. The pFET 341 might be configured to receive (e.g., have its control gate connected to receive) a control signal 344.

The first nFET 334 might be a high-voltage nFET, the second nFET might be a high-voltage depletion-mode nFET, and the pFET might be a high-voltage pFET. These transistors may be significantly larger in comparison to the nFETS 318, 324 and 330 that might be added per block of memory cells 250 in accordance with embodiments. As such, in comparing the related-art configuration of FIG. 3A to the configuration of the embodiment of FIG. 3B, the configuration of the embodiment of FIG. 3B might utilize significantly less surface area of a semiconductor die.

The control signal 336 might be configured to initially activate the first nFET 334 in response to the enable signal $304_{0-Y}$ having its first logic level, and to deactivate the first nFET 334 as the voltage level of the control signal $308_{0-Y}$ subsequently increases. For example, the voltage level of the control signal 336 might be the supply voltage Vcc. The control signal 344 might be initially configured to activate the pFET 342, and, after some delay, to deactivate the pFET 342. For example, the voltage level of the control signal 344 initially might be the supply voltage Vss (e.g., ground or 0V), and might then be changed to the supply voltage Vcc. In this manner, the voltage level of the voltage node 340 might serve to increase the voltage level of the control signal $308_{0-Y}$ to a voltage level near (e.g., equal to) the voltage level of the voltage node 340. As the voltage level of the control signal $308_{0-Y}$ increases, the first nFET 334 may deactivate, thereby trapping the voltage level of the control signal $308_{0-Y}$. After a period of time, e.g., a time to reach steady-state of the voltage level of the control signal $308_{0-Y}$, a voltage level of the control signal 344 might be changed to deactivate the pFET 342, thereby isolating the voltage node 340 from the output of the block select circuitry $308_{0-Y}$.

If the enable signal $304_{0-Y}$ has its second logic level, the control signal 336 might again be configured to initially activate the first nFET 334. The control signal 344 might again be initially configured to activate the pFET 342, and, after some delay, to deactivate the pFET 342. However, the voltage level of the control signal $308_{0-Y}$ may not increase in voltage level. For example, if the voltage level of the second logic level of the enable signal $304_{0-Y}$ is 0V, the voltage level of the control signal $308_{0-Y}$ may remain at 0V due to the activation of the first nFET 334. After a period of time, e.g., a time to reach steady-state of the voltage level of the control signal $308_{0-Y}$, a voltage level of the control signal 344 might be changed to deactivate the pFET 342, thereby isolating the voltage node 340 from the output of the block select circuitry $308_{0-Y}$.

Figure 5:
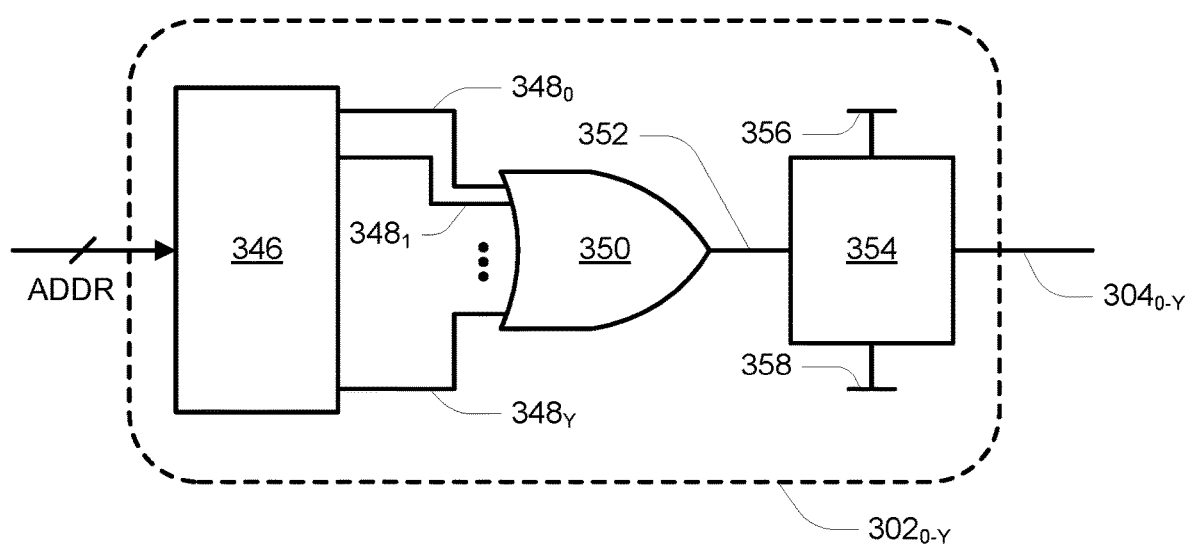
FIG. 5 is a block schematic of block decoding circuitry according to an embodiment.

FIG. 5 is a block schematic of block decoding circuitry $302_{0-Y}$ according to an embodiment. The block decoding circuitry $302_{0-Y}$ might include an address decoder 346 configured to receive the address signals ADDR and to provide a number of individual block select signals 348 (e.g., block select signals $348_0$-$348_Y$), each corresponding to a respective block of memory cells 250 (e.g., blocks of memory cells $250_0$-$250_Y$). Each of the block select signals $348_0$-$348_Y$ might indicate whether its respective block of memory cells 250 is selected for an access operation. For example, a block select signal 348 might have a first logic level (e.g., a logic high level) when its respective block of memory cells 250 is selected for the access operation, and might have a second logic level different than the first logic level (e.g., a logic low level) when its respective block of memory cells 250 is not selected for the access operation.

The block select signals $348_0$-$348_Y$ might be provided as inputs to a logic circuit, e.g., OR gate 350, configured to provide an output signal 352 having a first logic level (e.g., a logic high level) when at least one of the block select signals $348_0$-$348_Y$ indicates that its respective block of memory cells 250 is selected for the access operation, and having a second logic level different than its first logic level (e.g., a logic low level), when none of the block select signals $348_0$-$348_Y$ indicate that its respective block of memory cells 250 is selected for the access operation. The output signal 352 might be provided as input to a level shifter 354. The level shifter 354 might be connected between the voltage node 356 and the voltage node 358. A voltage level of the voltage node 356 might be higher than a voltage level of the voltage node 358. For example, the voltage level of the voltage node 356 might be a positive voltage level, e.g., the supply voltage Vcc, and the voltage level of the voltage node 358 might be a negative voltage level, e.g., −2V. When the output signal 352 has a particular logic level (e.g., its first logic level), the level shifter might provide the voltage level of the voltage node 356 to its output as the enable signal $304_{0-Y}$. When the output signal 352 has a different logic level (e.g., its second logic level), the level shifter might provide the voltage level of the voltage node 358 to its output as the enable signal $304_{0-Y}$.

Figure 6:
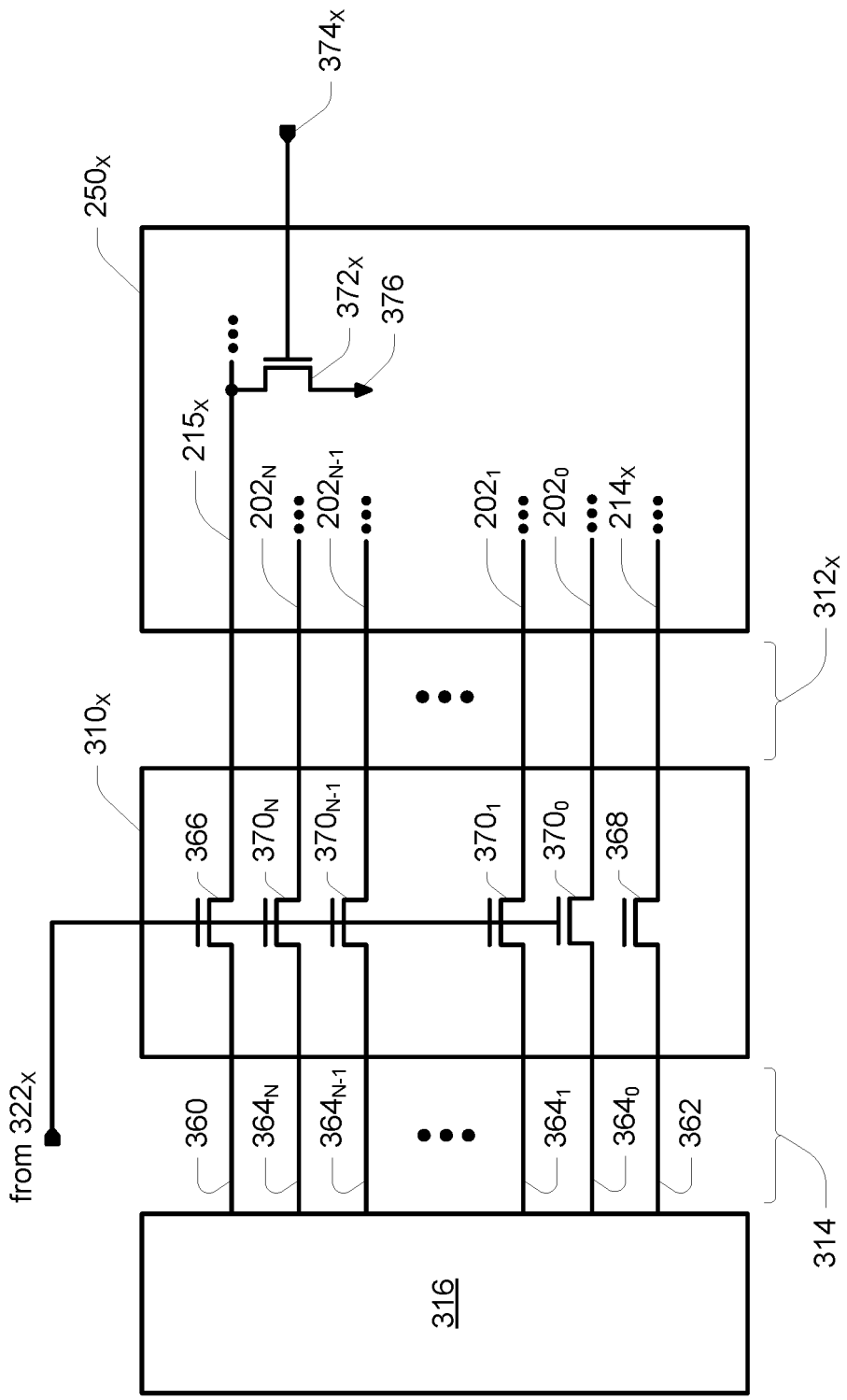
FIG. 6 is a block schematic of circuitry for access of a block of memory cells according to an embodiment.

FIG. 6 is a block schematic of circuitry for access of a block of memory cells according to an embodiment. The voltage generation and selection circuitry 316 might provide the global access and select lines 314 including a first global select line (e.g., a drain select line) 360 and a second global select line (e.g., a source select line) 362. The voltage generation and selection circuitry 316 might further provide the global access and select lines 314 including a plurality of global access lines 364 (e.g., global access lines $364_0$-$364_N$). The voltage generation and selection circuitry 316 might provide additional global access lines or global select lines depending upon the configuration of the blocks of memory cells 250 (e.g., blocks of memory cells $250_0$-$250_Y$). For example, additional global access lines might be included where the block of memory cells 250 utilizes dummy memory cells, and additional global select lines might be included where the blocks of memory cells 250 utilize multiple select gates (e.g., select gates 210 and/or 212) connected in series.

The global access and select lines 314 of FIG. 6 might be connected to a driver circuitry $310_x$. The driver circuitry $310_x$ might represent any of the driver circuitries $310_0$-$310_Y$. Each driver circuitry $310_x$ might include a corresponding switch (e.g., nFET) for each global access line or global select line. For example, the first global select line 360 might be connected to a switch (e.g., nFET) 366, the second global select line 362 might be connected to a switch (e.g., nFET) 368, and each global access line of the global access lines $364_0$-$364_N$ might be connected to a respective switch (e.g., nFET) $370_0$-$370_N$. In turn, the switch (e.g., nFET) 366 might be connected to a local select line (e.g., drain select line) $215_x$, the switch (e.g., nFET) 368 might be connected to a local select line (e.g., source select line) $214_x$, and each switch (e.g., nFET) $370_0$-$370_N$ might be connected to a respective local access line $202_0$-$202_N$ of the local access and select lines $312_x$.

For each block of memory cells $250_x$, its respective local select line (e.g., drain select line) $215_x$ might further be connected to a respective switch (e.g., nFET) $372_x$. The switch $372_x$ might be configured to receive (e.g., have its control gate connected to receive) a respective control signal $374_x$. Each control signal $374_x$ might be configured to have a first voltage level configured to activate its respective switch $372_x$ when its respective block $250_x$ is not selected for the access operation, and might be configured to have a second voltage level, different than its first voltage level, configured to deactivate its respective switch $372_x$ when its respective block $250_x$ is selected for the access operation. When a switch $372_x$ is activated, it will be deemed to sink current from its respective local select line $215_x$ to a current sink (e.g., ground node) 376, even though the voltage level of the respective local select line $215_x$ might be a same voltage level as the current sink 376. The current sink 376 might be a common current sink for each of the switches $372_x$. The first voltage level of a control signal $374_x$ might be some positive voltage level, such as the supply voltage Vcc, and the second voltage level of a control signal $374_x$ might be some neutral voltage level, such as the supply voltage Vss (e.g., ground or 0V).

Figure 7:
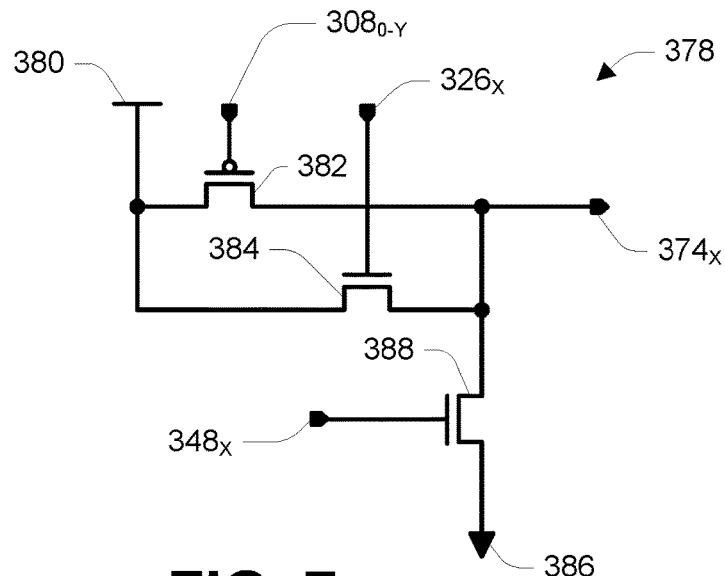
FIG. 7 is a schematic of additional decoding circuitry according to an embodiment.

FIG. 7 is a schematic of additional decoding circuitry 378 according to an embodiment. The decoding circuitry 378 might be one example of circuitry for decoding the control signal $374_x$ for its respective block of memory cells $250_x$. As such, a respective decoding circuitry 378 might correspond to each block of memory cells $250_0$-$250_Y$. The decoding circuitry 378 might include a pFET 382 connected between a voltage node 380 and an output of the decoding circuitry $378_x$ providing the control signal $374_x$. The decoding circuitry 378 might further include an nFET 384 connected in parallel with the pFET 382 connected between the voltage node 380 and the output of the decoding circuitry $378_x$ providing the control signal $374_x$. The output of the decoding circuitry 378 might further be selectively connected to a current sink, e.g., ground node, 386 through an nFET 388.

The voltage node 380 might be configured to receive some positive voltage level, such as the supply voltage Vcc. The pFET 382 might be configured to receive (e.g., have its control gate connected to receive) the control signal $308_{0-Y}$. The nFET 384 might be configured to receive (e.g., have its control gate connected to receive) the control signal $326_x$ for its corresponding block of memory cells $250_x$. The nFET 388 might be configured to receive (e.g., have its control gate connected to receive) the control signal $348_x$ for its corresponding block of memory cells $250_x$. In this manner, if the control signal $308_{0-Y}$ has its first logic level, corresponding to the selection of at least one of its blocks of memory cells $250_0$-$250_Y$ for an access operation, the output of the decoding circuitry 378 might be connected the current sink 386 only when its corresponding control signals $326_x$ and $348_x$ have voltage levels indicating that their respective block of memory cells 250, is selected for the access operation, and might otherwise be connected to the voltage node 380 for unselected blocks of memory cells 250. Similarly, if the control signal $308_{0-Y}$ has its second logic level, corresponding to the selection of none of its blocks of memory cells $250_0$-$250_Y$ for an access operation, the output of the decoding circuitry 378 might be connected to the voltage node 380 for each of its blocks of memory cells $250_0$-$250_Y$.

Figure 8:
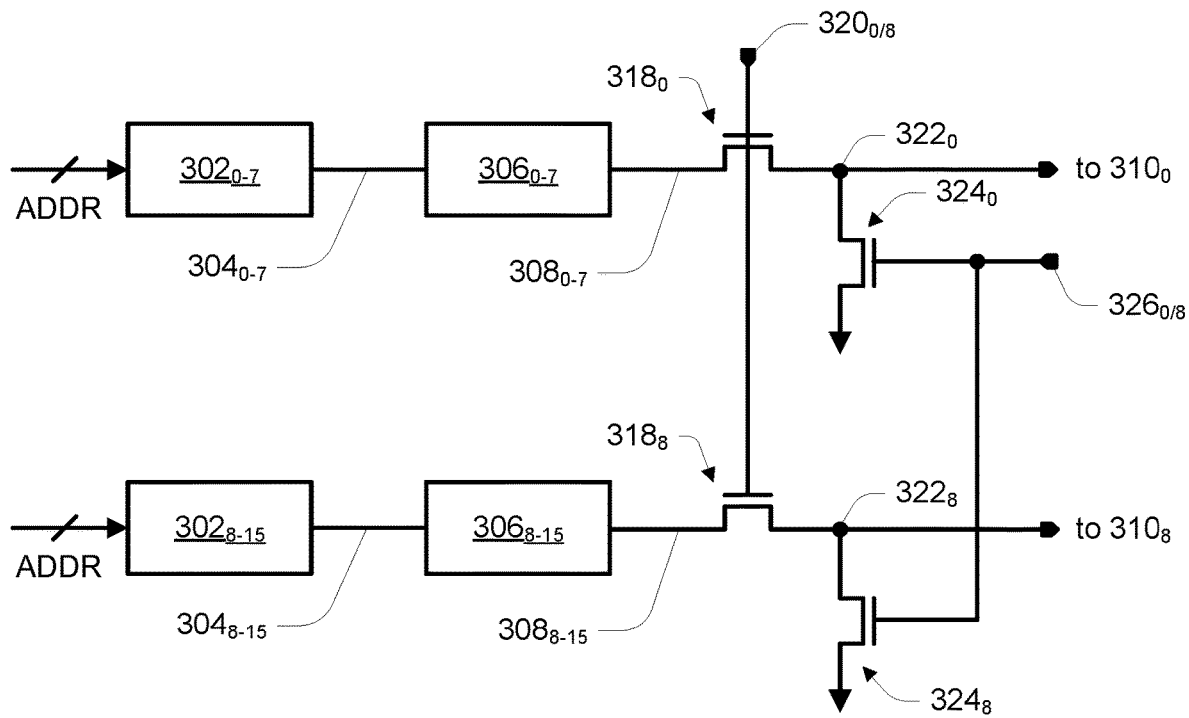
FIG. 8 is a block schematic of components of a row decoder for access of a plurality of blocks of memory cells according to another embodiment.

FIG. 8 is a block schematic of components of a row decoder for access of a plurality of blocks of memory cells according to another embodiment. For some embodiments, the control signals 320 and 326 might serve to control connections for a first subset of blocks of memory cells $250_0$-$250_Y$ and a second subset of blocks of memory cells $250_0$-$250_Y$. Consider the example where Y=7, and the control signals 320 and 326 are shared between two subsets of 8 blocks of memory cells, e.g., blocks of memory cells $250_0$-$250_7$ and blocks of memory cells $250_8$-$250_{15}$, of a plurality of blocks of memory cells $250_0$-$250_{15}$. Each block of memory cells of the blocks of memory cells $250_0$-$250_7$ might correspond to a respective block of memory cells of the blocks of memory cells $250_8$-$250_{15}$. For example, the block of memory cells $250_0$ might correspond to the block of memory cells $250_8$, the block of memory cells $250_1$ might correspond to the block of memory cells $250_9$, the block of memory cells $250_2$ might correspond to the block of memory cells $250_{10}$, etc. FIG. 8 depicts a simplified configuration for controlling these two subsets of blocks of memory cells using shared control signals 320 and 326. To simplify the discussion, circuitry downstream of the voltage nodes 322 is not depicted in FIG. 8, and the connections to voltage nodes 322 is depicted for only one block of memory cells for each of the subsets of blocks of memory cells. However, it will be apparent that such connections can be duplicated for each remaining block of memory cells. Similarly, the concepts described with reference to FIG. 8 might be extended to additional subsets of blocks of memory cells in a like manner. For example, where an additional subset of blocks of memory cells $250_{16}$-$250_{23}$ might be added, blocks of memory cells $250_0$, $250_8$ and $250_{16}$ might correspond to one another, and might share the control signals 320 and 326.

The discussion of the block decoding circuitry $302_{0-Y}$ and its enable signal $304_{0-Y}$ with reference to FIG. 3B might apply to both the block decoding circuitry $302_{0-7}$ and its enable signal $304_{0-7}$, and to the block decoding circuitry $302_{8-15}$ and its enable signal $304_{8-15}$. Similarly, the discussion of the block select circuitry $306_{0-Y}$ and its control signal $308_{0-Y}$ with reference to FIG. 3B might apply to both the block select circuitry $306_{0-7}$ and its control signal $308_{0-7}$, and to the block select circuitry $306_{8-15}$ and its control signal $308_{8-15}$.

Both the nFET $318_0$ corresponding to the block of memory cells $250_0$ of the blocks of memory cells $250_0$-$250_7$, and the nFET $318_8$ corresponding to the block of memory cells $250_8$ of the blocks of memory cells $250_8$-$250_{15}$, might be configured to receive the control signal $320_{0/8}$. However, while each control signal 320 in the discussion of FIG. 3B was configured to have its first voltage level configured to activate its respective nFET 318 when its respective block 250 was selected for the access operation, and configured to have its second voltage level configured to deactivate its respective nFET 318 when its respective block 250 was not selected for the access operation, the control signal $320_{0/8}$ might have its first voltage level configured to activate its respective nFETs $318_0$ and $318_8$ when any corresponding block of memory cells of any of the subsets of blocks of memory cells (e.g., block of memory cells $250_0$ and/or block of memory cells $250_8$) is selected for the access operation, and configured to have its second voltage level configured to deactivate its respective nFETs $318_0$ and $318_8$ when no corresponding block of memory cells of the subsets of blocks of memory cells (e.g., neither of the blocks of memory cells $250_0$ or $250_8$) is selected for the access operation.

Both the nFET $324_0$ corresponding to the block of memory cells $250_0$ of the blocks of memory cells $250_0$-$250_7$, and the nFET $324_8$ corresponding to the block of memory cells $250_8$ of the blocks of memory cells $250_8$-$250_{15}$, might be configured to receive the control signal $326_{0/8}$. However, while each control signal 326 in the discussion of FIG. 3B was configured to have its first voltage level configured to activate its respective nFET 324 when its respective block 250 was not selected for the access operation, and configured to have its second voltage level configured to deactivate its respective nFET 324 when its respective block 250 was selected for the access operation, the control signal $326_{0/8}$ might have its first voltage level configured to activate its respective nFETs $324_0$ and $324_8$ when no corresponding block of memory cells of the subsets of blocks of memory cells (e.g., neither of the blocks of memory cells $250_0$ or $250_8$) is selected for the access operation, and configured to have its second voltage level configured to deactivate its respective nFETs $324_0$ and $324_8$ when any corresponding block of memory cells of any of the subsets of blocks of memory cells (e.g., block of memory cells $250_0$ and/or block of memory cells $250_8$) is selected for the access operation.

Note that when the block of memory cells $250_0$ is selected for the access operation, and the block of memory cells $250_8$ is not selected for the access operation, the block of memory cells $250_8$ might still be isolated from its data lines 204. For example, where the enable signal $304_{8-15}$ indicates that none of its blocks of memory cells $250_8$-$250_{15}$ is selected for the access operation, its control signal $308_{8-15}$ might be 0V, such that it would have insufficient voltage level to connect the global access and select lines 314 to its local access and select lines 312, and its corresponding nFET 372 might also be activated to sink any current from its respective select line 215 as discussed with reference to FIGS. 6 and 7. It is further noted that the configuration of FIG. 8 might also incorporate an nFET 330 between the nFETs 324 and their respective voltage nodes 322 as described with reference to FIG. 3B.

Figure 9A:
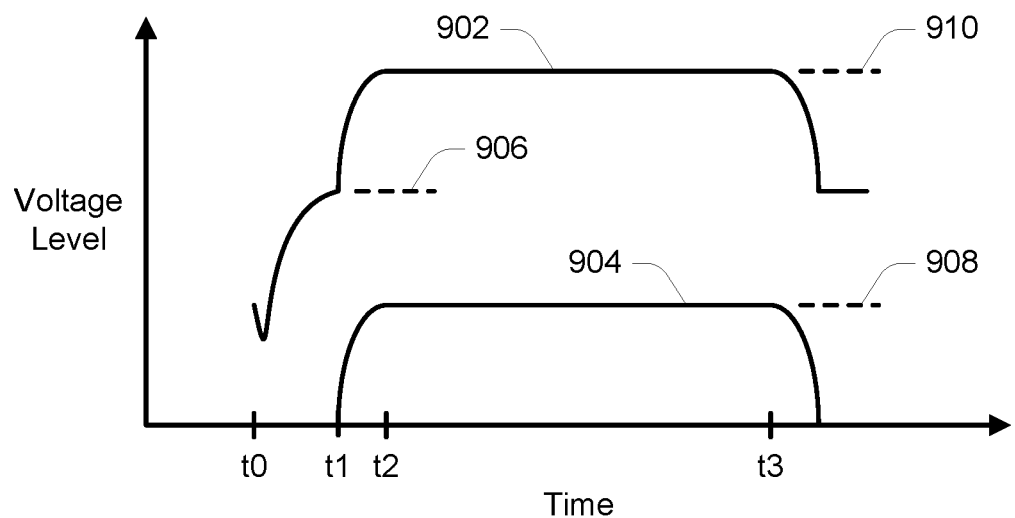
FIGS. 9A-9B are timing diagrams for access operations according to embodiments.
Figure 9B:
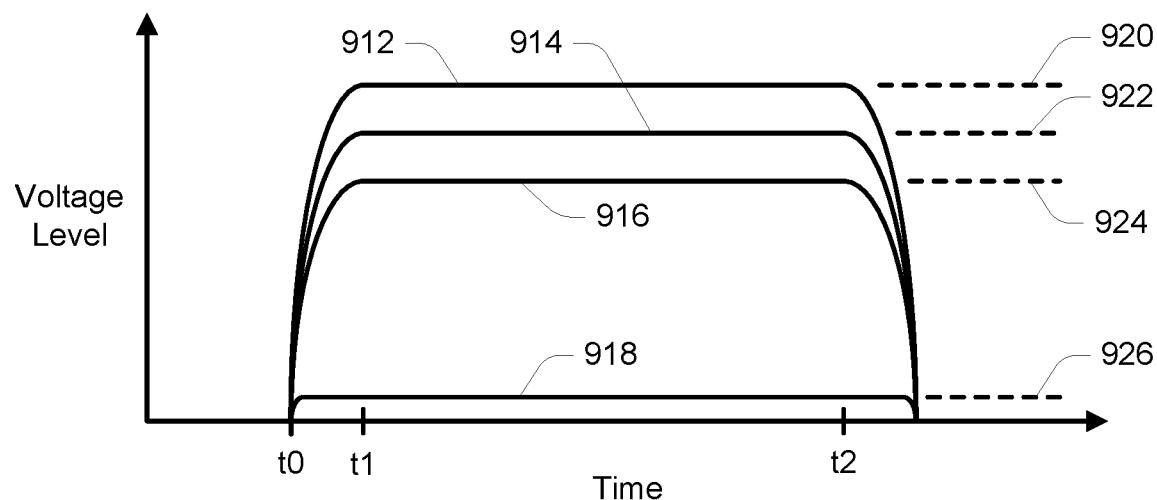

FIGS. 9A-9B are timing diagrams for access operations according to embodiments. FIG. 9A might represent a programming operation or a read operation as the concepts are similar despite utilizing different voltage levels. In FIG. 9A, the trace 902 might represent a voltage level of a voltage node 322, and the trace 904 might represent a voltage level of one or more unselected access lines of the programming or read operation. At time t0, the control signal $308_{0-Y}$ might be applied to a voltage node 322. Connection to the voltage node 322 might experience a momentary dip in voltage level before increasing its voltage level (e.g., trace 902) to the voltage level 906. For a programming operation, the voltage level 906 might represent 23V, and for a read operation, the voltage level 906 might represent 7V, for example. At time t1, the voltage level of the unselected access lines (e.g., trace 904) might be increased to voltage level 908. For a programming operation, the voltage level 908 might represent 10V, and for a read operation, the voltage level 908 might represent 5V, for example. As the voltage level of the unselected access lines increases, capacitive coupling may serve to induce an increase in voltage level of the voltage node 322 to the voltage level 910. As this voltage level begins to increase, the corresponding nFET 318 might begin to deactivate, and may float the voltage node 322, and trap the increased voltage level of the voltage node 322. Depending upon the coupling ratios, the difference between the voltage level 910 and the voltage level 906 may approach the value of the voltage level 908. At time t3, the access operation might be complete, and voltage levels might be decreased.

FIG. 9B might represent an erase operation. In FIG. 9B, the trace 912 might represent an erase voltage Verase. The trace 914 might represent a voltage level of a voltage node 322. The trace 916 might represent a select gate voltage Vgg to be applied to select lines (e.g., select lines 214 and 215). The trace 918 might represent a voltage level of one or more access lines of the erase operation. At time t0, the erase voltage Verase (e.g., trace 912), the voltage level of the voltage node 322 (e.g., trace 914), the select gate voltage Vgg (e.g., trace 916), and the access lines voltage (e.g., trace 918) might be increased to their respective voltage levels 920, 922, 924 and 926, respectively. The voltage level 920 might be 26V, the voltage level 922 might be 23V, the voltage level 924 might be 20V, and the voltage level 926 might be 1V, for example. Because the access line voltage levels (e.g., trace 918) are minimal, there might be no significant increase in the voltage level of the voltage node 322 due to capacitive coupling.

Figure 10:
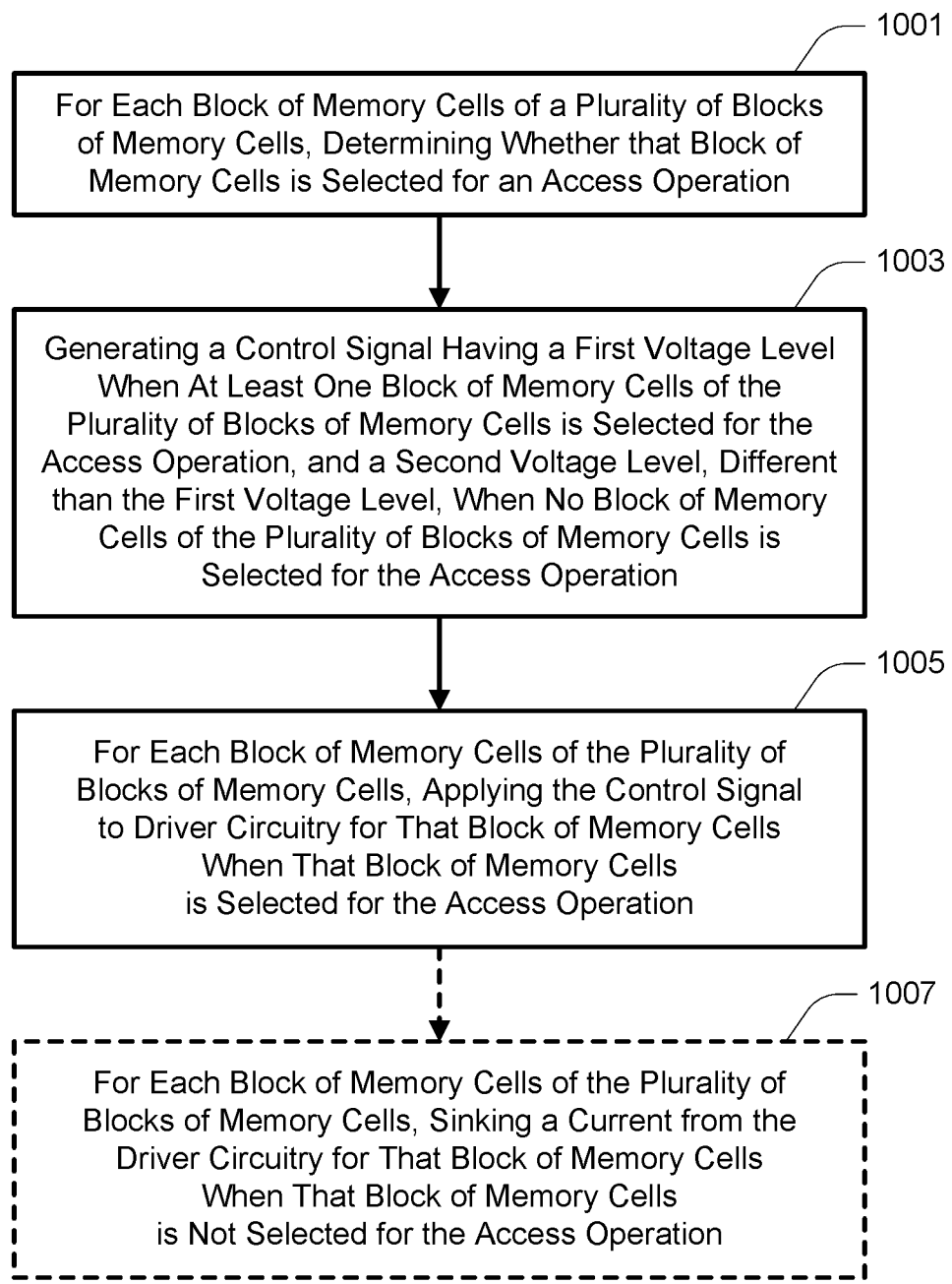
FIG. 10 is a flowchart of a method of operating a memory according to an embodiment.

FIG. 10 is a flowchart of a method of operating a memory according to an embodiment. For example, the method might include an access operation on an array of memory cells of the memory, e.g., a read (or sense) operation, a programming (or write) operation, or an erase operation.

At 1001, it is determined, for each block of memory cells of a plurality of blocks of memory cells, whether that block of memory cells is selected for an access operation. The plurality of blocks of memory cells might correspond to the blocks of memory cells $250_0$-$250_Y$ as discussed with reference to FIG. 3B, for example. At 1003, a control signal (e.g., control signal $308_{0-Y}$) is generated having a first voltage level when at least one block of memory cells of the plurality of blocks of memory cells is selected for the access operation, and having a second voltage level, different than the first voltage level, when no block of memory cells of the plurality of blocks of memory cells is selected for the access operation. At 1005, the control signal is applied to driver circuitry (e.g., to a control gate of an nFET 366, 368 or 370 of a driver circuitry 310) for each block of memory cells of the plurality of blocks of memory cells that is selected for the access operation. For some embodiments, the control signal might further be applied to driver circuitry for a block of memory cells of the plurality of blocks of memory cells having a corresponding block of memory cells of a different plurality of blocks of memory cells that is not selected for the access operation. Optionally, at 1007, a current might be sinked from the driver circuitry (e.g., sinked from a control gate of an nFET 366, 368 or 370 of a driver circuitry 310) for a (e.g., any) block of memory cells of the plurality of blocks of memory cells that is not selected for the access operation. Alternatively, or in addition, a current might be sinked from a select line (e.g., a select line 215) of each block of memory cells of the plurality of blocks of memory cells that is not selected for the access operation.

Figure 11:
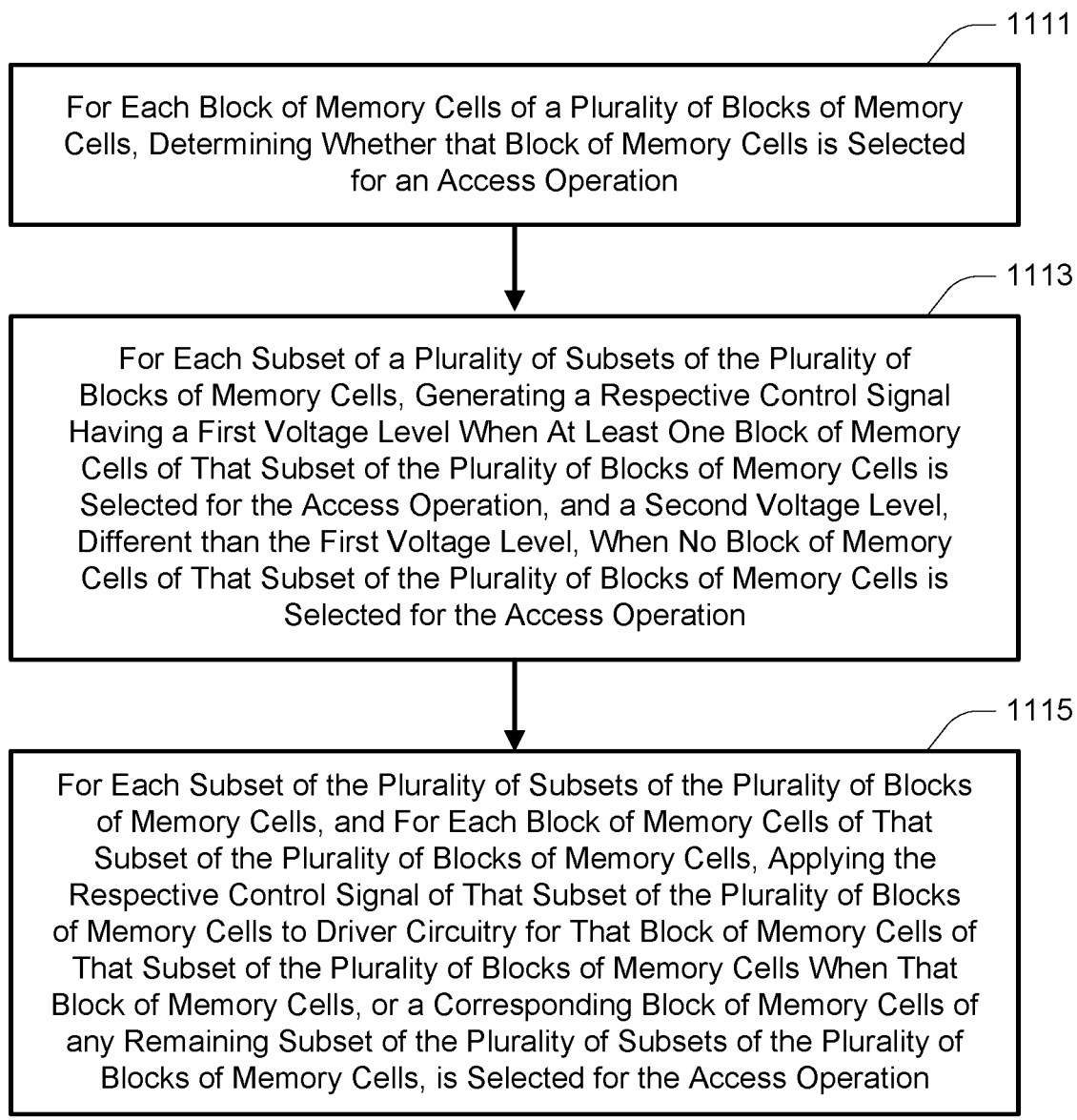
FIG. 11 is a flowchart of a method of operating a memory according to another embodiment.

FIG. 11 is a flowchart of a method of operating a memory according to another embodiment. For example, the method might include an access operation on an array of memory cells of the memory, e.g., a read (or sense) operation, a programming (or write) operation, or an erase operation.

At 1111, it is determined, for each block of memory cells of a plurality of blocks of memory cells, whether that block of memory cells is selected for an access operation. The plurality of blocks of memory cells might correspond to the blocks of memory cells $250_0$-$250_{15}$ as discussed with reference to FIG. 8, for example. At 1113, for each subset of a plurality of subsets (e.g., mutually exclusive subsets) of the plurality of blocks of memory cells, a respective control signal is generated having a first voltage level when at least one block of memory cells of that subset of the plurality of blocks of memory cells is selected for the access operation, and having a second voltage level, different than the first voltage level, when no block of memory cells of that subset of the plurality of blocks of memory cells is selected for the access operation. The subsets of the plurality of blocks of memory cells might correspond to the subsets of blocks of memory cells $250_0$-$250_7$ and of blocks of memory cells $250_8$-$250_{15}$, as discussed with reference to FIG. 8, for example. At 1115, for each subset of the plurality of subsets of the plurality of blocks of memory cells, and for each block of memory cells of that subset of the plurality of blocks of memory cells, the respective control signal of that subset of the plurality of blocks of memory cells is applied to driver circuitry (e.g., to a control gate of an nFET 366, 368 or 370 of a driver circuitry 310) for that block of memory cells of that subset of the plurality of blocks of memory cells when that block of memory cells of that subset of the plurality of blocks of memory cells, or a corresponding block of memory cells of any remaining subset of the plurality of subsets of the plurality of blocks of memory cells, is selected for the access operation. For some embodiments, a current might be sinked from the driver circuitry (e.g., sinked from a control gate of an nFET 366, 368 or 370 of a driver circuitry 310) for a (e.g., any) block of memory cells of the plurality of blocks of memory cells that is not selected for the access operation. Alternatively, or in addition, a current might be sinked from a select line (e.g., select line 215) of each block of memory cells of the plurality of blocks of memory cells that is not selected for the access operation.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:
an array of memory cells comprising a plurality of blocks of memory cells with each block of memory cells of the plurality of blocks of memory cells comprising a respective plurality of strings of series-connected memory cells;
a plurality of driver circuitries, each driver circuitry of the plurality of driver circuitries connected to a control gate of each memory cell of the respective plurality of strings of series-connected memory cells of a respective block of memory cells of the plurality of blocks of memory cells; and
block select circuitry having an output, wherein the output of the block select circuitry is selectively connected to each driver circuitry of the plurality of driver circuitries;
wherein the output of the block select circuitry is configured to provide a same control signal to each connected driver circuitry of the plurality of driver circuitries.

2. The memory of claim 1, wherein the output of the block select circuitry is selectively connected to a first driver circuitry of the plurality of driver circuitries in response to a first control signal, and wherein the output of the block select circuitry is selectively connected to a second driver circuitry of the plurality of driver circuitries in response to a second control signal independent of the first control signal.

3. A memory, comprising:
an array of memory cells comprising a plurality of blocks of memory cells;
a plurality of driver circuitries, each driver circuitry of the plurality of driver circuitries connected to a respective block of memory cells of the plurality of blocks of memory cells; and
block select circuitry having an output, wherein the output of the block select circuitry is selectively connected to each driver circuitry of the plurality of driver circuitries;
wherein the output of the block select circuitry is selectively connected to a first driver circuitry of the plurality of driver circuitries in response to a first control signal;
wherein the output of the block select circuitry is selectively connected to a second driver circuitry of the plurality of driver circuitries in response to a second control signal independent of the first control signal;
wherein the output of the block select circuitry is selectively connected to a first plurality of control gates of the first driver circuitry in response to the first control signal; and
wherein the output of the block select circuitry is selectively connected to a second plurality of control gates of the second driver circuitry in response to the second control signal.

4. A memory, comprising:
an array of memory cells comprising a plurality of blocks of memory cells;
a plurality of driver circuitries, each driver circuitry of the plurality of driver circuitries connected to a respective block of memory cells of the plurality of blocks of memory cells;
block select circuitry having an output, wherein the output of the block select circuitry is selectively connected to each driver circuitry of the plurality of driver circuitries;

a first switch connected between a first current sink and a first driver circuitry of the plurality of driver circuitries; and a second switch connected between a second current sink and a second driver circuitry of the plurality of driver circuitries;

wherein the output of the block select circuitry is selectively connected to the first driver circuitry in response to a first control signal;

wherein the output of the block select circuitry is selectively connected to the second driver circuitry in response to a second control signal independent of the first control signal;

wherein the first switch is connected to receive a third control signal; and wherein the second switch is connected to receive a fourth control signal independent of the third control signal.

5. The memory of claim 4, wherein the first switch is further selectively connected to the output of the block select circuitry in response to the first control signal, and wherein the second switch is further selectively connected to the output of the block select circuitry in response to the second control signal.

6. The memory of claim 4, wherein the first current sink and the second current sink are a same current sink.

7. The memory of claim 4, wherein the first current sink and the second current sink are each a ground node.

8. The memory of claim 4, further comprising:
a third switch connected between the first switch and the first driver circuitry, and connected to receive a fifth control signal; and
a fourth switch connected between the second switch and the second driver circuitry, and connected to receive the fifth control signal.

9. A memory, comprising:
an array of memory cells comprising a plurality of blocks of memory cells;
a plurality of driver circuitries, each driver circuitry of the plurality of driver circuitries connected to a respective block of memory cells of the plurality of blocks of memory cells;
block select circuitry having an output, wherein the output of the block select circuitry is selectively connected to each driver circuitry of the plurality of driver circuitries;
a first select line, wherein the first select line is connected to the respective block of memory cells of a first driver circuitry of the plurality of driver circuitries, and connected to the first driver circuitry;
a second select line, wherein the second select line is connected to the respective block of memory cells of a second driver circuitry of the plurality of driver circuitries, and connected to the second driver circuitry;
a first switch connected between a first current sink and the first select line; and
a second switch connected between a second current sink and the second select line;
wherein the output of the block select circuitry is selectively connected to the first driver circuitry in response to a first control signal;
wherein the output of the block select circuitry is selectively connected to the second driver circuitry in response to a second control signal independent of the first control signal;
wherein the first switch is connected to receive a third control signal; and wherein the second switch is connected to receive a fourth control signal independent of the third control signal.

10. A memory, comprising:
an array of memory cells comprising a plurality of blocks of memory cells;
a plurality of driver circuitries, each driver circuitry of the plurality of driver circuitries connected to a respective block of memory cells of the plurality of blocks of memory cells;
block select circuitry having an output, wherein the output of the block select circuitry is selectively connected to each driver circuitry of the plurality of driver circuitries; and
a global access line;
wherein, for each driver circuitry of the plurality of driver circuitries, the output of the block select circuitry is selectively connected to that driver circuitry in response to a respective control signal for that driver circuitry; and
wherein, for each driver circuitry of the plurality of driver circuitries, that driver circuitry is configured to selectively connect the global access line to a local access line of its respective block of memory cells responsive to the output of the block select circuitry when connected to the output of the block select circuitry in response to its respective control signal.

11. A memory, comprising:
an array of memory cells comprising a plurality of blocks of memory cells;
a plurality of driver circuitries, each driver circuitry of the plurality of driver circuitries connected to a respective block of memory cells of the plurality of blocks of memory cells;
block select circuitry having an output, wherein the output of the block select circuitry is selectively connected to each driver circuitry of the plurality of driver circuitries; and
a controller for access of the array of memory cells, wherein the controller is configured to cause the memory to:
for each block of memory cells of a plurality of blocks of memory cells, determine whether that block of memory cells is selected for an access operation;
generate a control signal at the output of the block select circuitry having a first voltage level when at least one block of memory cells of the plurality of blocks of memory cells is selected for the access operation, and having a second voltage level, different than the first voltage level, when no block of memory cells of the plurality of blocks of memory cells is selected for the access operation; and
for each block of memory cells of the plurality of blocks of memory cells, apply the control signal to the respective driver circuitry for that block of memory cells when that block of memory cells is selected for the access operation.

12. The memory of claim 11, wherein the controller is further configured to cause the memory to:
for each block of memory cells of the plurality of blocks of memory cells, apply the control signal to the respective driver circuitry for that block of memory cells when a corresponding block of memory cells of a different plurality of blocks of memory cells is selected for the access operation.

13. The memory of claim 11, wherein the controller is further configured to cause the memory to:

for a particular block of memory cells of the plurality of blocks of memory cells, sink a current from the respective driver circuitry for that block of memory cells to a current sink when the particular block of memory cells is not selected for the access operation.

14. The memory of claim 13, wherein the controller is further configured to cause the memory to:
for a different block of memory cells of the plurality of blocks of memory cells not selected for the access operation, isolate the respective driver circuitry for that block of memory cells from the current sink when a corresponding block of memory cells of a different plurality of memory cells is selected for the access operation.

15. The memory of claim 11, wherein the controller being configured to cause the memory device to apply the control signal to the respective driver circuitry for a particular block of memory cells of the plurality of blocks of memory cells comprises the controller being configured to cause the memory device to apply the control signal to a control gate of a switch of that driver circuitry.

16. The memory of claim 11, wherein the controller is further configured to cause the memory to connect local access lines of a particular block of memory cells of the plurality of blocks of memory cells to global access lines in response to applying the control signal to respective driver circuitry for the particular block of memory cells.

17. The memory of claim 11, wherein the controller being configured to cause the memory device to generate the control signal at the output of the block select circuitry having the first voltage level comprises the controller being configured to cause the memory device to generate the control signal at the output of the block select circuitry having a positive voltage level, and wherein the controller being configured to cause the memory device to generate the control signal at the output of the block select circuitry having the second voltage level comprises the controller being configured to cause the memory device to generate the control signal at the output of the block select circuitry having a negative voltage level.

18. The memory of claim 17, wherein the controller being configured to cause the memory device to generate the control signal at the output of the block select circuitry having the positive voltage level further comprises the controller being configured to cause the memory device to generate the control signal at the output of the block select circuitry having a voltage level that is less than or equal to a maximum voltage level to be applied to an access line or to a select line of a block of memory cells of the plurality of blocks of memory cells selected for the access operation.

19. A memory, comprising:
an array of memory cells comprising a plurality of blocks of memory cells, wherein the plurality of blocks of memory cells comprises a plurality of subsets of blocks of memory cells;
a plurality of driver circuitries comprising a plurality of subsets of driver circuitries, wherein each subset of driver circuitries of the plurality of subsets of driver circuitries corresponds to a respective subset of blocks of memory cells of the plurality of subsets blocks of memory cells, and wherein each driver circuitry of the plurality of driver circuitries is connected to a respective block of memory cells of its respective subset of blocks of memory cells;
a plurality of block select circuitries, wherein each block select circuitry of the plurality of block select circuitries corresponds to a respective subset of driver circuitries of the plurality of subsets of driver circuitries and to the respective subset of blocks of memory cells of its respective subset of driver circuitries, wherein each block select circuitry of the plurality of block select circuitries has an output, and wherein the output of each block select circuitry of the plurality of block select circuitries is selectively connected to each driver circuitry of its respective subset of driver circuitries; and
a controller for access of the array of memory cells, wherein the controller is configured to cause the memory to:
for each block of memory cells of the plurality of blocks of memory cells, determine whether that block of memory cells is selected for an access operation, wherein each block of memory cells of any subset of blocks of memory cells of the plurality of subsets of blocks of memory cells has a respective corresponding block of memory cells for each remaining subset of blocks of memory cells of the plurality of subsets of blocks of memory cells; and
for each subset of blocks of memory cells of the plurality of subsets of blocks of memory cells:
generate a respective control signal at the output of the respective block select circuitry for that subset of blocks of memory cells having a first voltage level when at least one block of memory cells of that subset of blocks of memory cells is selected for the access operation, and having a second voltage level, different than the first voltage level, when no block of memory cells of that subset of blocks of memory cells is selected for the access operation, wherein the respective control signal for that subset of blocks of memory cells is independent of the respective control signal for each remaining subset of blocks of memory cells of the plurality of subsets of blocks of memory cells; and
for each block of memory cells of that subset of blocks of memory cells, apply the respective control signal for that subset of blocks of memory cells to the respective driver circuitry for that block of memory cells when that block of memory cells, or its corresponding block of memory cells of any remaining subset of blocks of memory cells of the plurality of subsets of blocks of memory cells, is selected for the access operation.

20. The memory of claim 19, wherein the controller is further configured to cause the memory to sink a current from a select line for each block of memory cells of the plurality of blocks of memory cells that is not selected for the access operation.

21. The memory of claim 19, wherein the controller being configured to cause the memory device to apply the respective control signal for a particular subset of blocks of memory cells of the plurality of blocks of memory cells to the respective driver circuitry for a block of memory cells of the particular subset of blocks of memory cells comprises the controller being configured to cause the memory device to apply that control signal to a control gate of a field-effect transistor of that driver circuitry.

22. The memory of claim 19, wherein the controller is further configured to cause the memory device to:
for each subset of blocks of memory cells of the plurality of subsets of blocks of memory cells:
for each block of memory cells of that subset of blocks of memory cells, sink a current from the respective driver circuitry for that block of memory cells when neither that block of memory cells, nor any of its corresponding blocks of memory cells of any remaining subset of blocks of memory cells of the plurality of subsets of blocks of memory cells, is selected for the access operation.

* * * * *